United States Patent
Chen

(10) Patent No.: US 10,594,292 B2
(45) Date of Patent: Mar. 17, 2020

(54) SURFACE ACOUSTIC WAVE DEVICE

(71) Applicant: Zhuohui Chen, Ottawa (CA)

(72) Inventor: Zhuohui Chen, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 478 days.

(21) Appl. No.: 15/419,535

(22) Filed: Jan. 30, 2017

(65) Prior Publication Data

US 2018/0219525 A1    Aug. 2, 2018

(51) Int. Cl.
| | |
|---|---|
| *H03H 9/25* | (2006.01) |
| *H03H 9/02* | (2006.01) |
| *H03H 3/08* | (2006.01) |
| *H03H 9/145* | (2006.01) |
| *H03H 9/64* | (2006.01) |
| *H03H 9/72* | (2006.01) |

(52) U.S. Cl.
CPC .......... *H03H 9/02582* (2013.01); *H03H 3/08* (2013.01); *H03H 9/14544* (2013.01); *H03H 9/64* (2013.01); *H03H 9/725* (2013.01)

(58) Field of Classification Search
CPC .. H03H 9/02582; H03H 3/08; H03H 9/02574; H03H 9/14544; H03H 9/64; H03H 9/725; H01L 41/22
USPC ..... 310/313 R, 313 A–313 D, 344; 29/25.35
See application file for complete search history.

(56) References Cited

U.S. PATENT DOCUMENTS

| | | | | |
|---|---|---|---|---|
| 4,952,832 A | * | 8/1990 | Imai | H03H 9/02582 310/313 A |
| 5,274,345 A | | 12/1993 | Gau | |
| 5,343,107 A | * | 8/1994 | Shikata | H03H 3/08 310/313 A |
| 5,497,726 A | * | 3/1996 | Shikata | H03H 3/08 117/104 |
| 5,920,143 A | * | 7/1999 | Tarui | H03H 9/02582 310/313 A |
| 8,165,682 B2 | | 4/2012 | Gopalsami et al. | |
| 8,378,553 B1 | | 2/2013 | Naumenko et al. | |
| 8,436,509 B1 | * | 5/2013 | Branch | G01N 29/022 310/313 R |

(Continued)

FOREIGN PATENT DOCUMENTS

| | | |
|---|---|---|
| CN | 101540591 A | 9/2009 |
| CN | 101630947 A | 1/2010 |

(Continued)

OTHER PUBLICATIONS

Fu et al., "Aluminum Nitride Thin Film Acoustic Wave Device for Microfluidic and Biosensing Applications", Acoustic Waves, Sep. 2010, pp. 264-298.

(Continued)

*Primary Examiner* — Thomas M Dougherty

(57) ABSTRACT

The embodiments herein relate to surface acoustic wave (SAW) devices, such as filters and duplexers. The surface acoustic wave device includes piezoelectric layer and a high acoustic velocity layer coupled to the piezoelectric layer at a first surface of the high acoustic velocity layer. At least one transducer is provided within the high acoustic velocity layer and flush with or near the first surface. The at least one transducer is configured to propagate a surface acoustic wave having an operating wavelength along the piezoelectric layer.

18 Claims, 15 Drawing Sheets

(56) References Cited

U.S. PATENT DOCUMENTS

| | | | |
|---|---|---|---|
| 9,431,996 B2* | 8/2016 | Watanabe | H03H 9/0222 |
| 2003/0001696 A1 | 1/2003 | Yoshida et al. | |
| 2003/0030119 A1 | 2/2003 | Higgins, Jr. et al. | |
| 2007/0228873 A1 | 10/2007 | Lin et al. | |
| 2015/0123746 A1 | 5/2015 | Nakamura et al. | |
| 2015/0326200 A1* | 11/2015 | Grannen | H03H 9/171 |
| | | | 310/346 |
| 2017/0222619 A1 | 8/2017 | Iwamoto et al. | |
| 2018/0159507 A1* | 6/2018 | Goto | H01L 41/0477 |

FOREIGN PATENT DOCUMENTS

| | | |
|---|---|---|
| CN | 101677234 A | 3/2010 |
| CN | 102437832 A | 5/2012 |
| CN | 102637259 A | 8/2012 |
| WO | 2016084526 A1 | 6/2016 |

OTHER PUBLICATIONS

Hashimoto et al., "High Performance Surface Acoustic Resonators in 1-3 GHz Range Using ScA1 N/6H-SiC Structure", pp. 1-3.

Hasimoto et al., "High Q Surface Acoustic Wave Reconators in 2-3 GHz Range Using ScA1N/ Single Crystalline Diamond Structure", pp. 1-4.

Loebl et al., "Piezoelectric Thin A1N Films for Bulk Acoustic Wave (BAW) Resonators", Materials Chemistry and Physics 79 (2003), pp. 143-146.

Clement et al., "SAW Characteristics of A1N Films Sputtered on Silicon Substates", Ultrasonics 42 (2004), pp. 403-407.

Lehtonen et al., "SAW Impedance Element Filters for 5 GHz and Beyond", 1999 IEEE Ultrasonics Symposium , pp. 395-399.

Yamanouchi et al., "SAW Propogation Characteristics and Fabrication Technology of Piezoelectric Thin Film/Diamond Structure", 1989 Ultrasonics Symposium, pp. 351-354.

Zhang et al., "Surface Acoustic Wave Propogation Characteristics of ScaIn/Diamond Structure with Buried Electrode", 2014 Symposium on Piezoelectricity, Acoustic Waves, and Device Applications, Oct. 30-Nov. 2, pp. 271-274, Beijing, China.

"Aluminum Nitride Thin Film Acoustic Wave Device for Microfluidic and Biosensing Applications" by Fu et al. Acoustic Waves Book edited by Don W. Dissanayake, ISBN 978-953-307-111-4, pp. 466, Sep. 2010.

"High Q surface acoustic wave resonators in 2-3 GHz range using ScAlN-single crystalline diamond structure" by Hashimoto et al. (Conf.: Ultrasonics Symposium (IUS), 2012 IEEE International).

"Surface acoustic wave propagation characteristics of ScAlN/ diamond structure with buried electrode" by Zhang et al. (Piezoelectricity Acoustic Waves and Device Applications (SPAWDA) 2014 Symposium on, pp. 271-274, 2014).

"SAW Characteristics of AlN Films Sputtered on Silicon Substrates" by Clement, M. et al. Ultrasonics 42 (2004) 403-407.

"Piezoelectric thin AlN films for bulk acoustic wave (BAW) resonators" by Loebl, H.P. et al. Materials Chemistry and Physics 79 (2003) 143-146.

"SAW Impedance Element Filters for 5 GHz and beyond" by Lehtonen, S. et al. 1999 IEEE Ultrasonics Symposium, pp. 395-399.

"High-Performance Surface Acoustic Wave Resonators in the 1 to 3 GHz Range Using a ScAlN/6H-SiC Structure" by Hashimoto, K. et al. IEEE Trans. on Ultrasonics, Ferroelectrics and Frequency Control, vol. 60, No. 3, Mar. 2013.

"SAW Propagation Characteristics and Fabrication Technology Piezoelectric Thin Film / Diamond Structure" by Yamanouchi, K. et al. IEEE 1989 Ultrasonics Symposium. pp. 351-354.

* cited by examiner

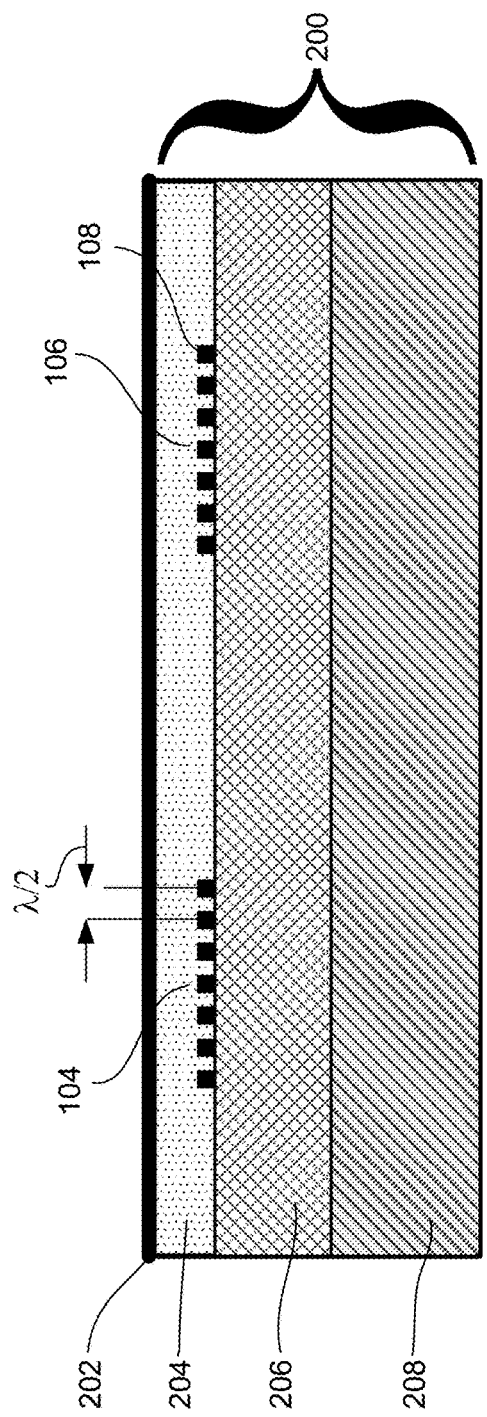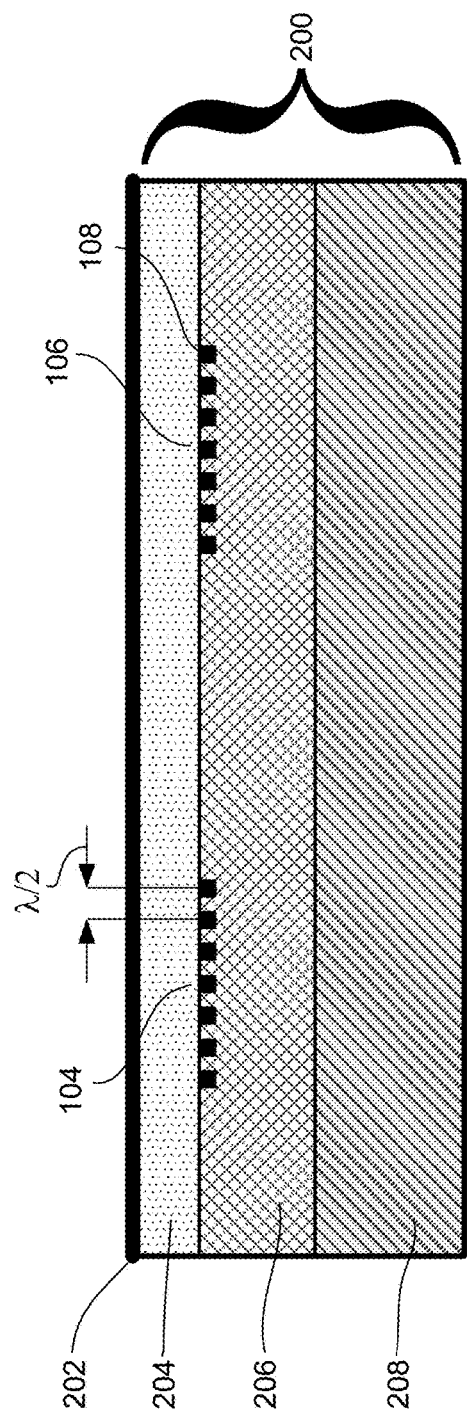

SURFACE ACOUSTIC WAVE DEVICE

FIELD

The embodiments disclosed herein relate to surface acoustic wave (SAW) devices. In particular, the embodiments relate to SAW filters, resonators, and/or duplexers with high power durability.

BACKGROUND

In communication systems (both terminal and base station infrastructure), surface acoustic wave (SAW) filters and resonators are widely used. For new standards such as the E-UTRA used in the 5G-TG4-CA, there is growing demand for higher operating frequency, lower insertion loss, higher transmitting power, and/or wider channel bandwidth. New piezoelectric materials or structures are desirable to support the growing demand for higher frequency and wider channel bandwidth. As the transmitting power increases, the durability of the SAW device deteriorates. Therefore, it may be useful to increase the durability for a higher operating frequency and higher transmitting power.

Scandium-doped AlN (ScAlN) films have been attempted due to their high piezoelectricity, high thermal conductivity, and relatively high acoustic wave velocity. One such structure is described in "*High Q surface acoustic wave resonators in 2-3 GHz range using ScAlN-single crystalline diamond structure*" by Hashimoto et al. (Conf.: Ultrasonics Symposium (IUS), 2012 IEEE International), herein expressly incorporated by reference in its entirety.

Similarly, another such structure is described in "*Surface acoustic wave propagation characteristics of ScAlN/diamond structure with buried electrode*" by Zhang et al. (*Piezoelectricity Acoustic Waves and Device Applications (SPAWDA) 2014 Symposium on*, pp. 271-274, 2014), herein expressly incorporated by reference in its entirety.

These structures have been explored but have not been adequate to address the specific challenges as described herein.

SUMMARY

The embodiments described below may provide a SAW device with a reduced von Mises stress within the interdigital transducer (IDT) electrode thereby permitting greater durability with increased power. The embodiments described herein may also achieve additional benefits and advantages not explicitly stated herein.

According to some aspects, the present disclosure describes a surface acoustic wave device comprising a piezoelectric layer; and a high acoustic velocity layer coupled to the piezoelectric layer at a first surface of the high acoustic velocity layer. Further the device comprises at least one transducer within the high acoustic velocity layer and flush with or near the first surface, the at least one transducer being configured to propagate a surface acoustic wave having an operating wavelength ($\lambda$) along the piezoelectric layer.

According to other aspects, the present disclosure describes a method of manufacturing a surface acoustic wave (SAW) device, the method comprising providing a high acoustic velocity layer and etching the high acoustic velocity layer with an electrode pattern. The method further comprises providing at least one transducer within the electrode pattern within the high acoustic velocity layer, the transducer being configured to propagate or receive a surface acoustic wave and having an operating wavelength; and providing a piezoelectric layer over the at least one transducer and the high acoustic velocity layer.

According to some embodiments of the previous aspects, the present disclosure describes the device comprising a metallic layer on a surface of the piezoelectric layer opposite to the high acoustic velocity layer.

According to the previous embodiment the present disclosure describes the device wherein the metallic layer is formed from at least one of aluminum (Al), copper (Cu), platinum (Pt), Aluminum-copper alloys (Al/Cu/Al), molybdenum (Mo), tungsten (W), titanium (Ti), gold (Au), nickel (Ni) and titanium nitride (TiN), and silver (Ag), cobalt (Co), chromium (Cr), copper-iron alloy (Cu—Fe), niobium (Nb), nickel (Ni), zinc (Zn), or zirconium (Zr).

According to some embodiments of the previous aspects and embodiments, wherein each of the at least one transducer comprises a plurality of interdigital transducer (IDT) electrodes, the IDT electrodes each having an IDT thickness.

According to the previous embodiment the present disclosure describes the device wherein the IDT thickness is between approximately $0.01\lambda$ and approximately $0.1\lambda$.

According to the previous embodiment the present disclosure describes the device wherein the IDT thickness is approximately $0.02\lambda$ or $0.08\lambda$.

According to some embodiments of the previous aspects, the present disclosure describes the device comprising a metallic layer, wherein each of the at least one transducer comprises a plurality of interdigital transducer (IDT) electrodes, the IDT electrodes each having an IDT thickness and wherein the IDT electrodes are formed from aluminum and/or copper.

According to some embodiments of the previous aspects and previous embodiments, wherein a thickness of the piezoelectric layer is less than $\lambda$.

According to the previous embodiment the present disclosure describes the device wherein the thickness of the piezoelectric layer is between approximately $0.15\lambda$ and approximately $0.258\lambda$.

According to some embodiments of the previous aspects and previous embodiments, wherein the thickness of the piezoelectric layer is approximately $0.2\lambda$.

According to some embodiments of the previous aspects and previous embodiments, wherein the piezoelectric layer comprises a scandium-doped aluminum-nitride (ScAlN) layer.

According to the previous embodiment the present disclosure describes the device wherein scandium-doping of the ScAlN layer is between approximately 40 to approximately 45 atomic percent.

According to some embodiments of the previous aspects and previous embodiments, wherein the high acoustic velocity layer comprises a diamond layer.

According to the previous embodiment the present disclosure describes the device wherein the diamond layer has a thickness greater than $\lambda$.

According to some embodiments of the previous aspects and previous embodiments, wherein the high acoustic velocity layer has an acoustic velocity between approximately 8,000 m/s and approximately 10,000 m/s.

BRIEF DESCRIPTION OF THE DRAWINGS

Reference will now be made, by way of example, to the accompanying drawings which show example embodiments of the present application, and in which:

FIG. 2A is a side cross-section view of the SAW filter of FIG. 1A having the IDT electrodes on the surface of the high acoustic velocity layer;

FIG. 2B is a side cross-section view of the SAW filter having the IDT electrodes below the surface of the high acoustic velocity layer;

Similar reference numerals may have been used in different figures to denote similar components.

DESCRIPTION OF EXAMPLE EMBODIMENTS

Figure 1:
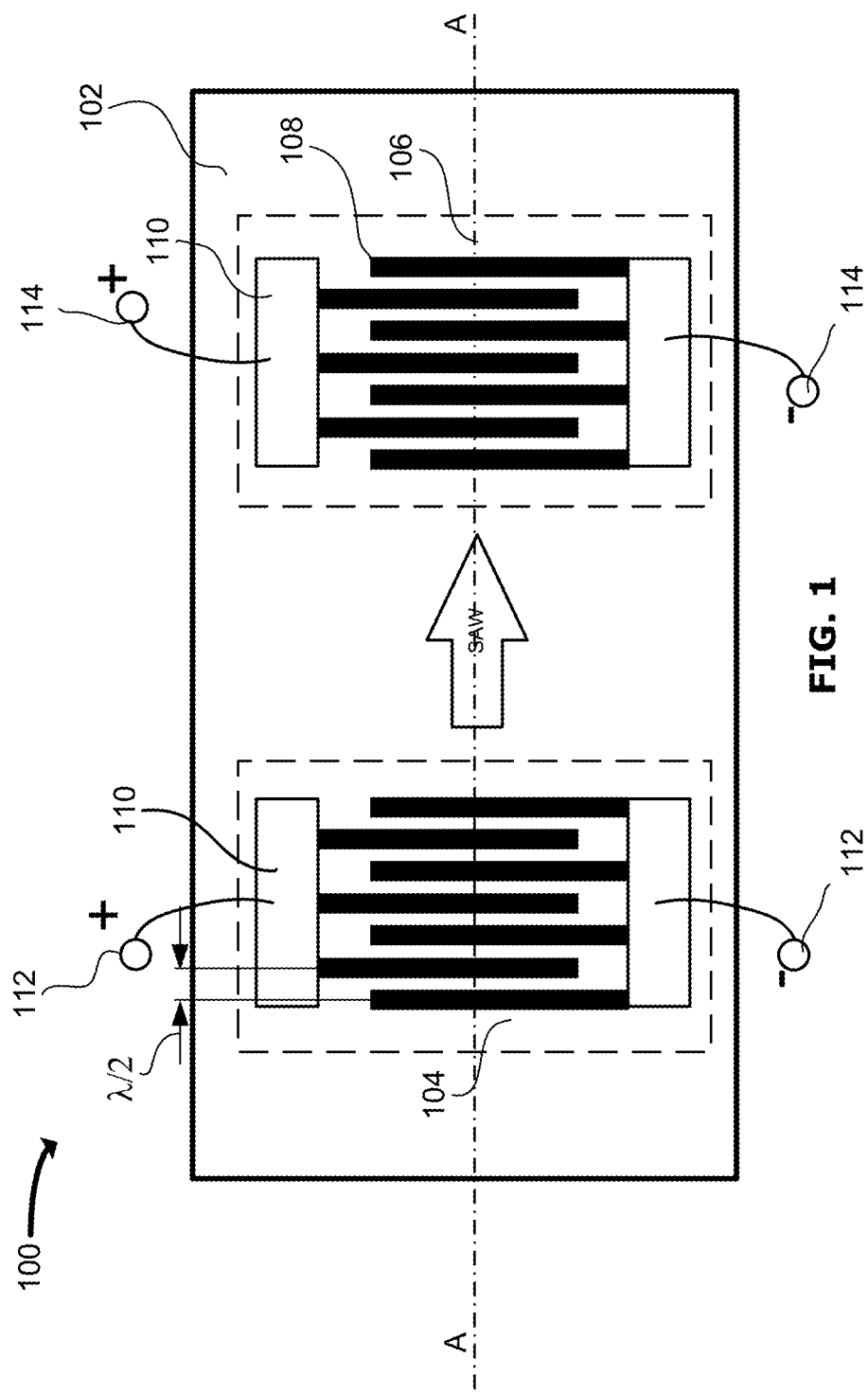
FIG. 1 is a top plan view of an example SAW filter having interdigital transducer (IDT) electrodes.

An example of a physical implementation of a surface acoustic wave (SAW) device 100, such as for example a wideband transversal filter, is shown in FIG. 1. The SAW device may be intended for use at the front-end of a radio-frequency (RF) transmitter/receiver able to handle high power, such as greater than 32 dBm. Although the description below makes reference to a particular SAW device 100, the techniques described herein may equally apply to other types of SAW filters and/or resonators. For example, any SAW transducer, interdigital transducer (IDT), Inter-digitated Inter-digital transducer (IIDT), ladder-type filter, or other such devices may incorporate the multi-layer structure(s) described herein.

With reference to a particular examples demonstrated in FIG. 1, the SAW device 100, in this example embodiment a basic filter, may include a multi-layered body 102 (as discussed further below) with an input transducer 104 and an output transducer 106, each indicated by their respective dashed box. The input transducer 104 and the output transducer 106 may be coupled to the body 102. The input transducer 104 and the output transducer 106 each comprise a plurality of electrically conductive interdigital transducer (IDT) electrodes 108. The IDT electrodes 108 may be generally parallel to each other within their respective transducer 104/106 and each of the fingers of each IDT electrode 108 may be spaced by half of an operating wavelength ($\lambda/2$). The IDT electrodes 108 may be electrically coupled to lead-out bonding pad 110 for either supplying power to the IDT electrodes 108 by way of input terminals 112 (in the case of the input transducer 104) or receiving power by way of output terminals 114 from the IDT electrodes 108 (in the case of the output transducer 106). The IDT electrodes 108 may have an IDT thickness between approximately $0\lambda$ and approximately $0.10\lambda$, for example between about $0.01\lambda$ and about $0.10\lambda$, for example about $0.02\lambda$ or about $0.08\lambda$. In the present disclosure, a layer or material may be described as having a thickness of approximately $0\lambda$ to indicate that the layer or material provides zero electrical potential and no mechanical mass-loading effect (e.g., for simulation purposes); a thickness of approximately $0\lambda$ does not indicate that the layer or material is omitted.

When power is supplied to input terminals 112, the IDT electrodes 108 of the input transducer 104 convert the electrical signal energy into a SAW (e.g. transduction) propagating along the body 102. The SAW may be carried across the body 102 and the SAW may be converted back into an electrical signal by the IDT electrodes 108 of the output transducer 106. The electrical signal may then be provided at the output terminals 114, for example to be received by a processor (not shown) via an analog-to-digital converter (not shown). The center frequency of a SAW filter may be given by the velocity of the SAW divided by the operating wavelength.

FIGS. 2A and 2B illustrate a side sectional views of different embodiments of the SAW device 100 along line A-A. In each embodiment, the multi-layered body 102 of the SAW device 100 may comprise four layers 200: a base layer 208, a high acoustic velocity layer 206 (e.g., a diamond layer), a piezoelectric layer 204 (e.g., scandium-doped aluminum-nitride (ScAlN) film), and a metallic layer or surface 202. The IDT electrodes 108 may be any suitable conductive material (e.g., copper (Cu) or other metal as further described below). The thickness of the piezoelectric layer 204 ($h_{ScAlN}$) may be less than the operating wavelength and may be between approximately $0.15\lambda$ and $0.258\lambda$, for example about $0.2\lambda$, for an IDT electrode 108 thickness ($h_{Cu}$) of less than or equal to approximately $0.06\lambda$. In other example embodiments, the thickness of the piezoelectric layer 204 may be $0.2\lambda$ and the IDT electrode 108 thickness may be between approximately 0λ and approximately 0.10λ. The thickness of the high acoustic velocity layer 206 may be greater than one operating wavelength. For the examples provided herein, the operating wavelength may be between approximately 1 μm and approximately 4 μm.

The layers 200 may be provided on top of each other generally using any suitable semiconductor manufacturing techniques as further described with reference to FIG. 18 below. The base layer 208 may comprise a silicon substrate where a high acoustic velocity layer 206 may be placed. The high acoustic velocity layer 206 may enable a high acoustic velocity (e.g. 8,000 m/s to 10,000 m/s) for the SAW and may enable a high operating frequency. In the embodiment of FIG. 2A, the IDT electrodes 108 may be placed on the high acoustic velocity layer 206 and may be encased in a thin piezoelectric layer 204 comprising a scandium-doped aluminum nitride. In the embodiment of FIG. 2B, the IDT electrodes 108 may be placed or embedded below a top surface of the high acoustic velocity layer 206 so the electrodes 108 are generally flush with the top surface of the high acoustic velocity layer 206 and covered with a thin piezoelectric layer 204. In the present disclosure, "generally flush with the top surface" includes the electrodes being substantially flush with or near the top surface (e.g., within +/−0.01λ of the surface). In both embodiments shown in FIGS. 2A and 2B, the IDT electrodes 108 are located at or near the surface of the high acoustic velocity layer 206 where the high acoustic velocity layer 206 is coupled to the piezoelectric layer 204.

In one example, the piezoelectric layer 204 comprises a $Sc_{0.41}Al_{0.59}N$ (e.g. Sc-doped AlN with Sc content of 41 atomic percent (at. %) and Al content of 59 at. %). The piezoelectric layer 204 may have a thickness of less than one wavelength (λ). When the piezoelectric layer 204 is below a cutoff thickness, no wave mode may be detected due to the low electromechanical coupling coefficient ($k^2$). When the thickness of the piezoelectric layer 204 is increased, the electromechanical coupling coefficient may gradually improve for particular wave modes. As the piezoelectric layer 204 increases in thickness over 1λ, the underlying high acoustic velocity layer 206 may have a diminishing benefit to the operation of the SAW device 100. When the thickness of the piezoelectric layer 204 increases beyond about 3λ in height, the piezoelectric layer 204 may be viewed as semi-infinite and the high acoustic velocity layer 206 may provide negligible benefit to the SAW device 100.

The top layer in the examples shown is a metallic layer 202. The metallic layer 202 may completely encompass the IDT electrodes 108 and may provide an electrical short boundary condition (e.g. zero electrical potential boundary condition). In the example embodiments, a metallic material may be selected for the metallic layer 202 having a high electric conductance and a high acoustic velocity. For example, the metallic layer 202 may be copper, aluminum, beryllium, or molybdenum. In some example embodiments where the metallic layer 202 may have a thickness much less than the thickness of the piezoelectric layer 204, the acoustic properties of the metallic material may have a lesser importance compared to the electrical properties of the metallic material.

For a SAW device 100 made using a very thin piezoelectric layer 204 such as described in the embodiments herein, the acoustic wave may penetrate deeper into the high acoustic velocity layer 206 as the thickness of the piezoelectric layer 204 is less than one wavelength. The energy of the SAW may be largely dissipated in the high acoustic velocity layer 206 where the wave predominantly propagates. When the thickness of the piezoelectric layer 204 is increased, the acoustic velocity gradually changes to that of the piezoelectric layer 204.

Figure 3A:
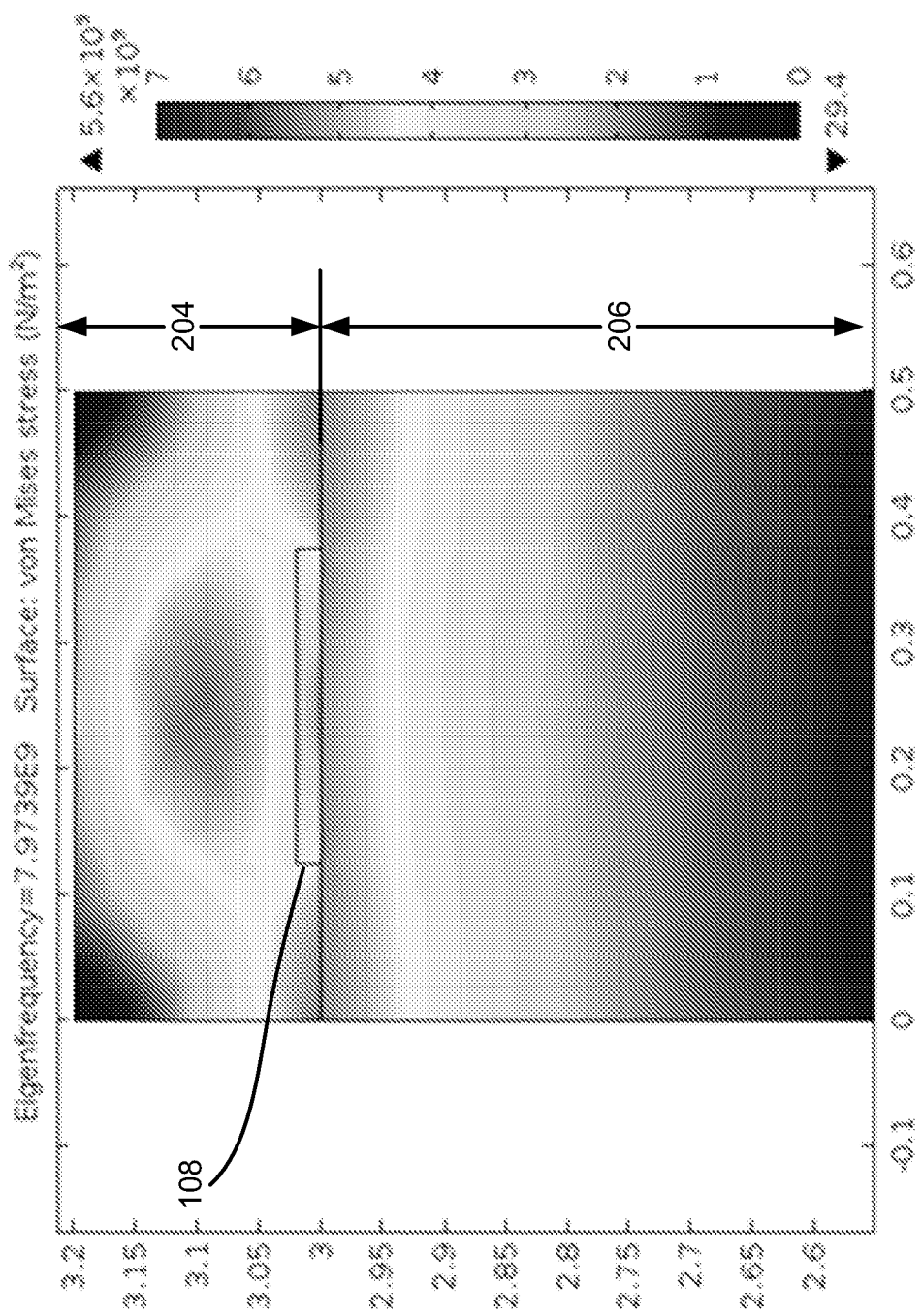
FIG. 3A is a plot showing a simulation of the von Mises stress for an example SAW filter having the IDT electrodes on the surface of the high acoustic velocity layer as demonstrated in FIG. 2A.
Figure 3B:
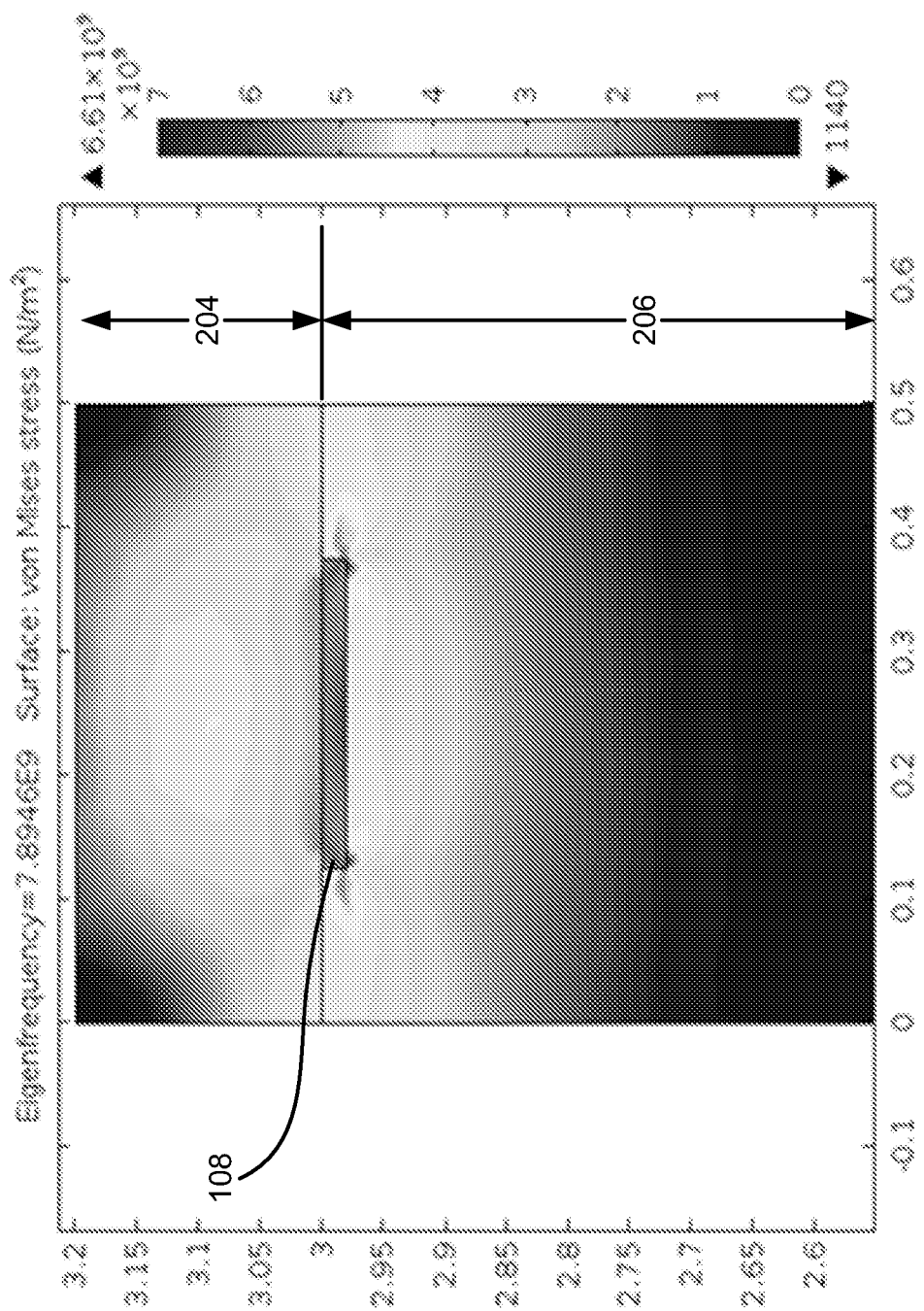
FIG. 3B is a plot showing a simulation of the von Mises stress for an example SAW filter having IDT electrodes below the surface of the high acoustic velocity layer as demonstrated in FIG. 2B.

The von Mises stresses of different embodiments of the SAW device 100 were simulated using the commercial finite element analysis software, COMSOL Multiphysics. The results of these simulations are shown in FIGS. 3A and 3B. The simulations, equations, and graphs used or presented herein are merely for demonstration and illustration only and are not intended to be limiting or promissory.

The simulation parameters for FIGS. 3A and 3B include the piezoelectric layer 204 comprising a ScAlN with a thickness of 0.2λ, the high acoustic velocity layer 206 comprising diamond with a thickness of 3λ, and the IDT electrode 108 having a thickness of 0.02λ, where Δ=1 μm. FIG. 3A shows simulation results of Sezawa mode for a SAW device having the IDT electrodes 108 on the surface of the high acoustic velocity layer 206. FIG. 3B shows simulation results for a SAW device having the IDT electrode 108 below the surface of the high acoustic velocity layer 206. FIGS. 3A and 3B show simulation results for SAW devices having the IDT electrode 108 covered by the piezoelectric layer 204, and having the metallic layer 202 overlying the piezoelectric layer 204. As may be observed from the simulations, von Mises stress is relatively low within the electrode 108, with higher von Mises stress emanating from the electrode 108 within the high acoustic velocity layer 206 and generally above the electrode 108 within the piezoelectric layer 204.

With the electrode 108 on the high acoustic velocity layer 206 (simulation results shown in FIG. 3A), the simulated maximum von Mises stress within the electrode 108 was found to be $4.475 \times 10^9$ N/m$^2$ with an electromechanical coupling coefficient of 15.40%. When the electrode 108 is within the high acoustic velocity layer 206 (simulation results shown in FIG. 3B), the simulated maximum von Mises stress within the electrode 108 was found to be $2.249 \times 10^9$ N/m$^2$ with an electromechanical coupling coefficient of 15.18%. It should be noted that positioning the electrode 108 next to but not embedded in the piezoelectric layer 204 (as simulated in FIG. 3B) was found to result in von Mises stress inside the electrode 108 that is less compared to that when the electrode 108 is embedded inside the piezoelectric layer 204 (as simulated in FIG. 3A).

The von Mises simulations shown in FIGS. 3A and 3B were repeated for SAW devices using different metals for the electrodes 108. Unless stated otherwise, the plots described herein show the Sezawa wave mode. It was found that the Sezawa wave mode resulted in the largest electromechanical coupling coefficient, out of different possible wave modes. The simulated average von Mises stresses (N/m$^2$) inside the electrodes 108 for these different embodiments are summarized in FIG. 4. In these examples, copper, aluminum, platinum, and gold electrodes 108 have been simulated, with the electrodes either placed on the surface of the high acoustic velocity layer 206 and within the piezoelectric layer 204 (labelled "in ScAlN") or placed within the high acoustic velocity layer 206 (labelled "in Diamond"), and the metallic layer 202 positioned on top of the piezoelectric layer 204. As may be observed from FIG. 4, the von Mises stress for a particular electrode 108 metal is less when the electrode 108 is embedded within the high acoustic velocity layer 206 (e.g. diamond in these examples). As may also be observed, examples with aluminum and gold electrodes 108 placed within the high acoustic velocity layer 206 may also exhibit less von Mises stress than the other examples simulated.

Figure 5:
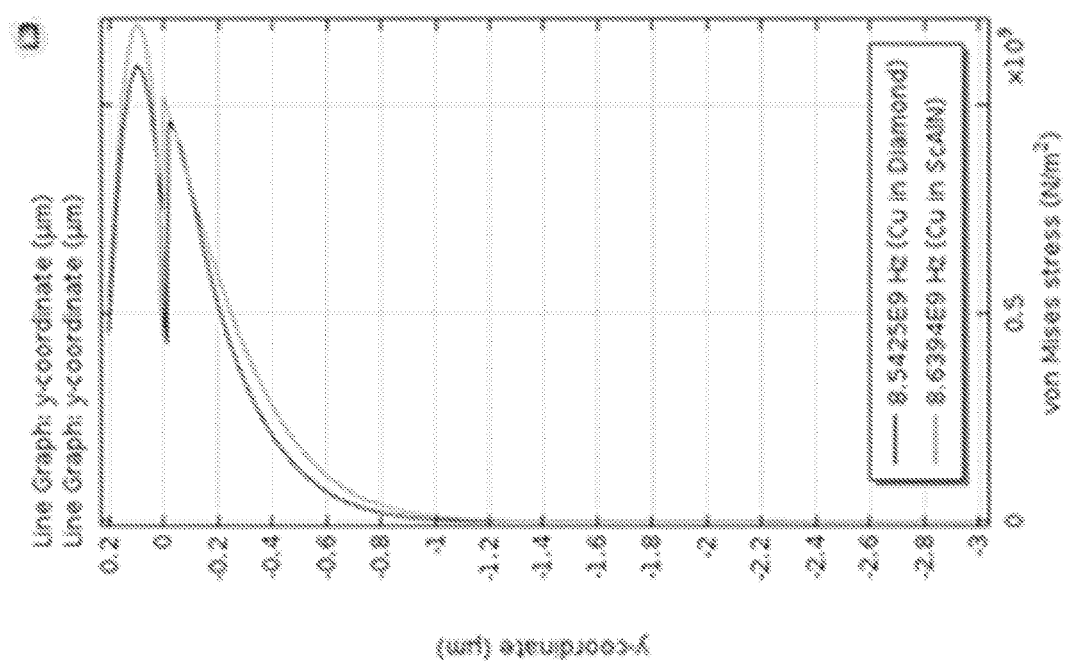
FIG. 5 shows simulated von Mises stress profiles along the depth direction of example SAW filters having IDT electrodes on the surface of the high acoustic velocity layer or below the surface of the high acoustic velocity layer.

FIG. 5 shows stress profiles of two example SAW devices along the depth direction, along the center of the devices. FIG. 5 shows the stress profile of an example SAW device in which a copper electrode 108 (at y-coordinate −0.02 μm to 0 μm) is positioned within the high acoustic velocity layer 206 (labeled as "Cu in Diamond") compared to a stress profile of an example SAW device in which the electrode 108 (at y-coordinate 0 μm to 0.02 μm) is positioned on the surface of the acoustic velocity layer 206 (labeled as "Cu in ScAlN").

Figure 4:
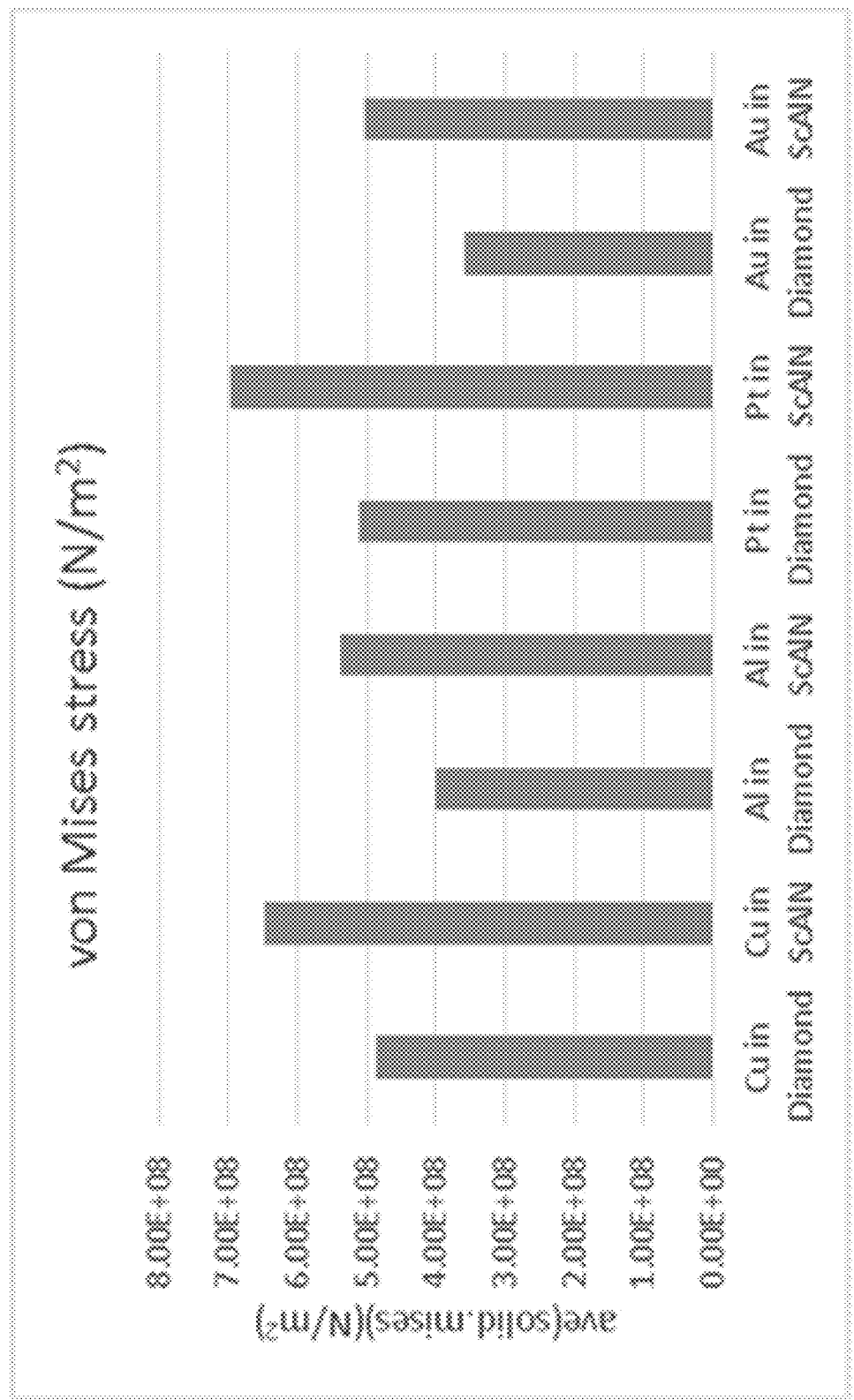
FIG. 4 is a plot showing simulated average von Mises stresses inside the IDT electrodes of example SAW filters having IDT electrodes of different metals on the surface of the high acoustic velocity layer or below the surface of the high acoustic velocity layer.
Figures 6A, 6B:
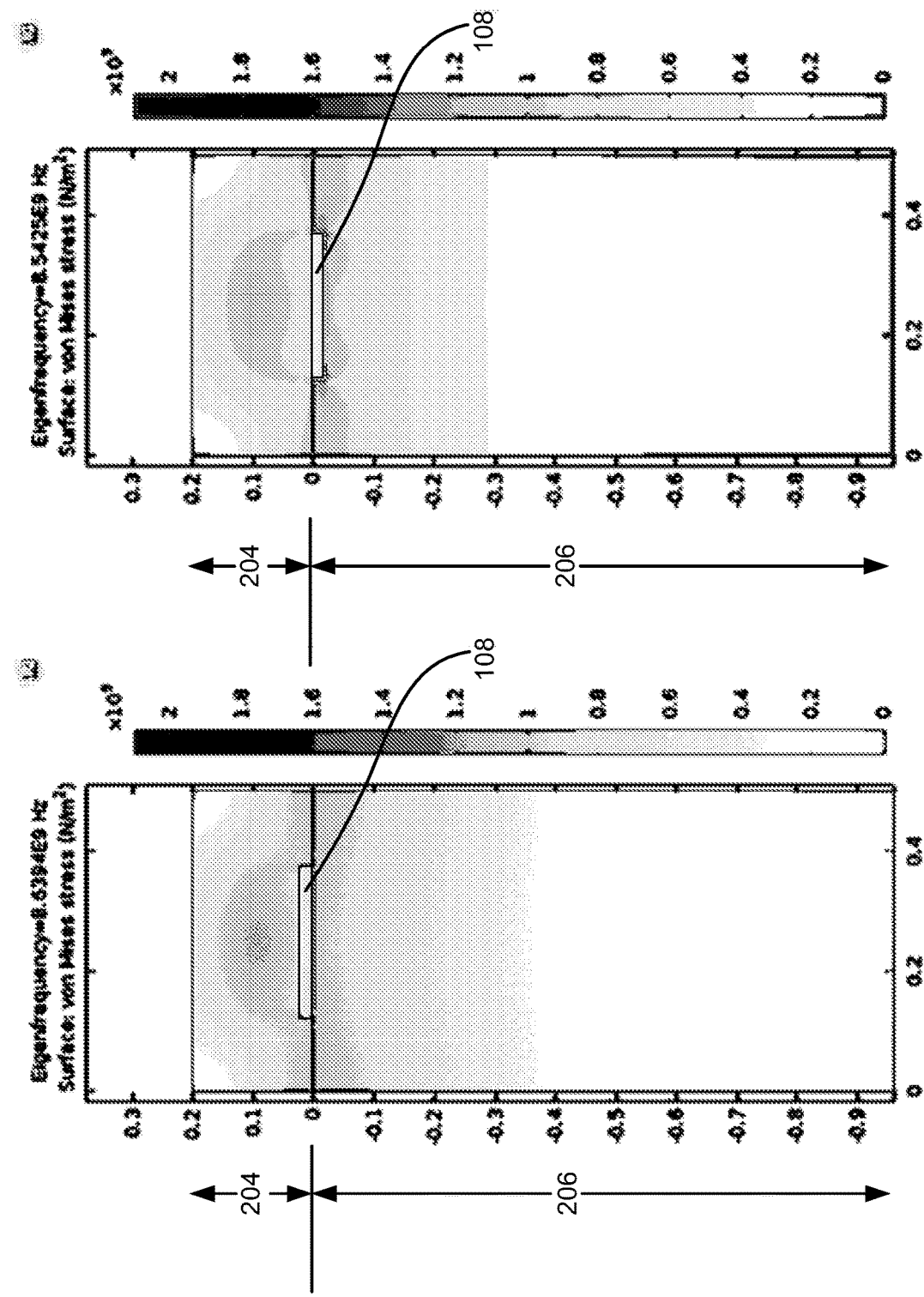
FIGS. 6A and 6B are plots showing simulations demonstrating the von Mises stress profiles of example SAW filters having copper IDT electrodes on the surface of the high acoustic velocity layer and below the surface of the high acoustic velocity layer, respectively.

FIGS. 6A and 6B show example simulation results illustrating the von Mises stress profiles for two of the examples summarized in FIG. 4. FIGS. 6A and 6B show simulation results for example SAW devices having copper electrodes 108 provided on the high acoustic velocity layer 206 and within the high acoustic velocity layer 206, respectively. FIGS. 6A and 6B are shown for illustration purposes only.

Figure 7:
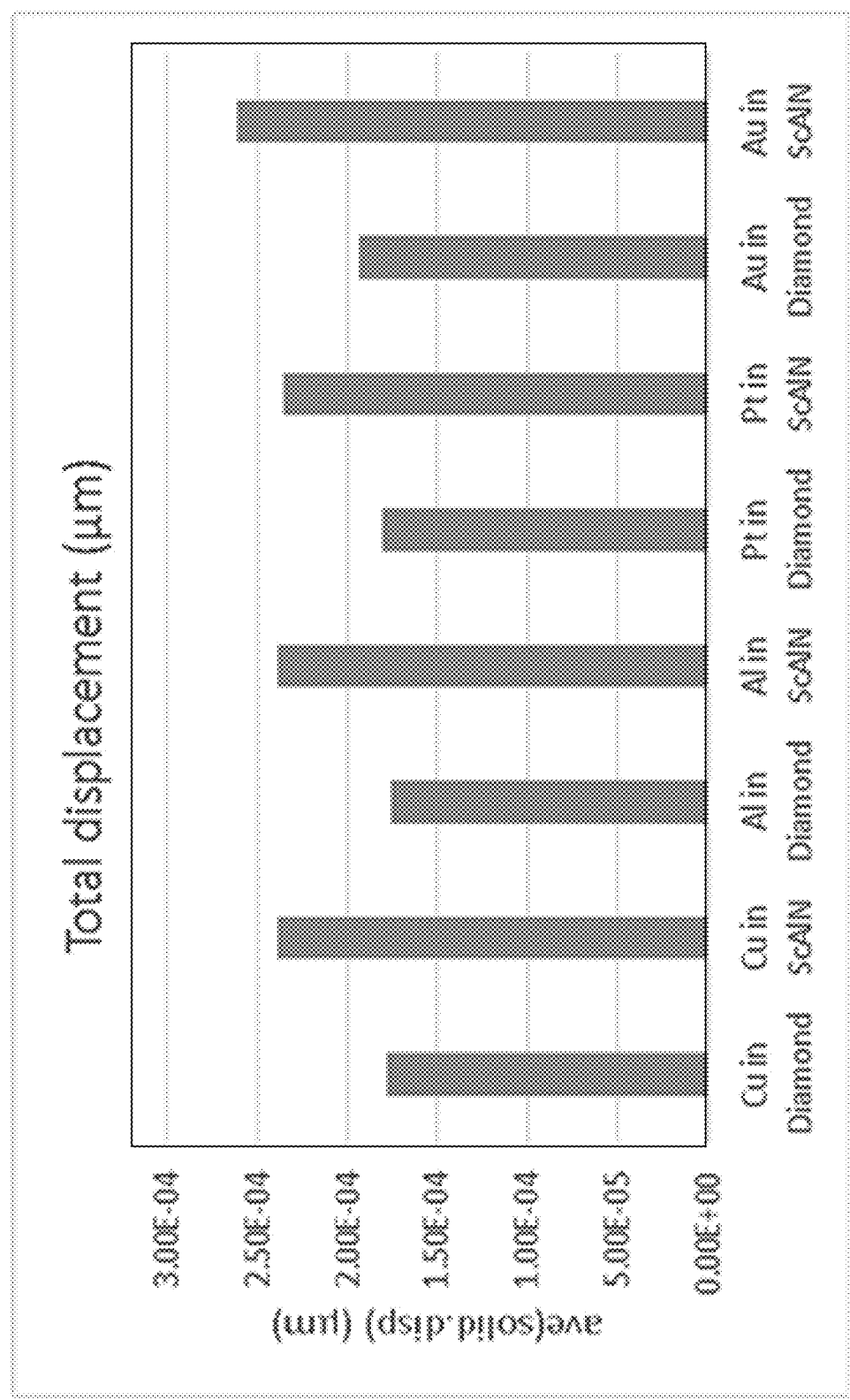
FIG. 7 is a plot showing simulated total displacements inside the IDT electrode for example SAW filters using various IDT electrode metals on the surface of the high acoustic velocity layer or below the surface of the high acoustic velocity layer.

FIG. 7 shows simulated total displacement within the electrodes 108 of the different example SAW devices. FIG. 7 plots the average total displacement (μm) inside the electrode 108.

Figure 8:
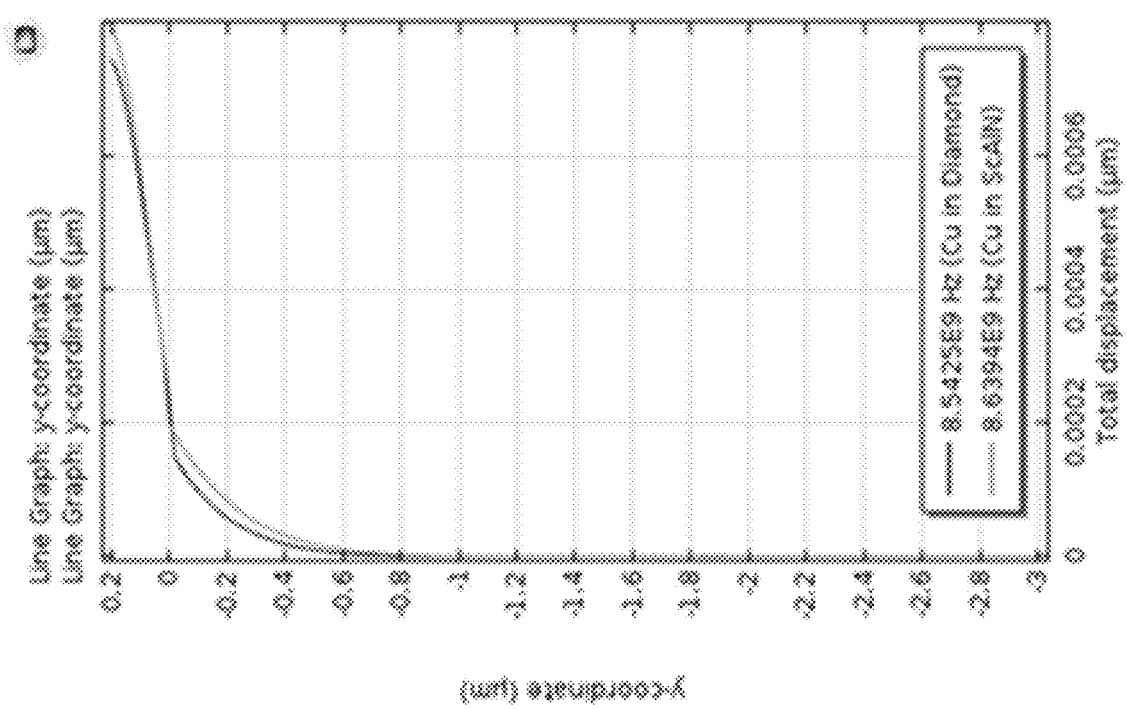
FIG. 8 shows simulated total displacement profiles along the depth direction of example SAW filters having IDT electrodes on the surface of the high acoustic velocity layer or below the surface of the high acoustic velocity layer.

FIG. 8 plots the total displacement of the electrode 108 of two example SAW devices along the depth direction, along the center of the devices. FIG. 8 shows the total displacement profile of an example SAW device in which a copper electrode 108 (at y-coordinate −0.02 μm to 0 μm) is positioned within the high acoustic velocity layer 206 (labeled as "Cu in Diamond") compared to a stress profile of an example SAW device in which the electrode 108 (at y-coordinate 0 μm to 0.02 μm) is positioned on the surface of the acoustic velocity layer 206 (labeled as "Cu in ScAlN"). In both example devices, the metallic layer 202 is positioned on the piezoelectric layer 204. As may be observed, the average total displacement inside the electrode 108 is less in the example where the electrode 108 is within the high acoustic velocity layer 206. It may be noted that the average total displacement of the electrode 108 varies only slightly between the different metal types.

Figure 9:
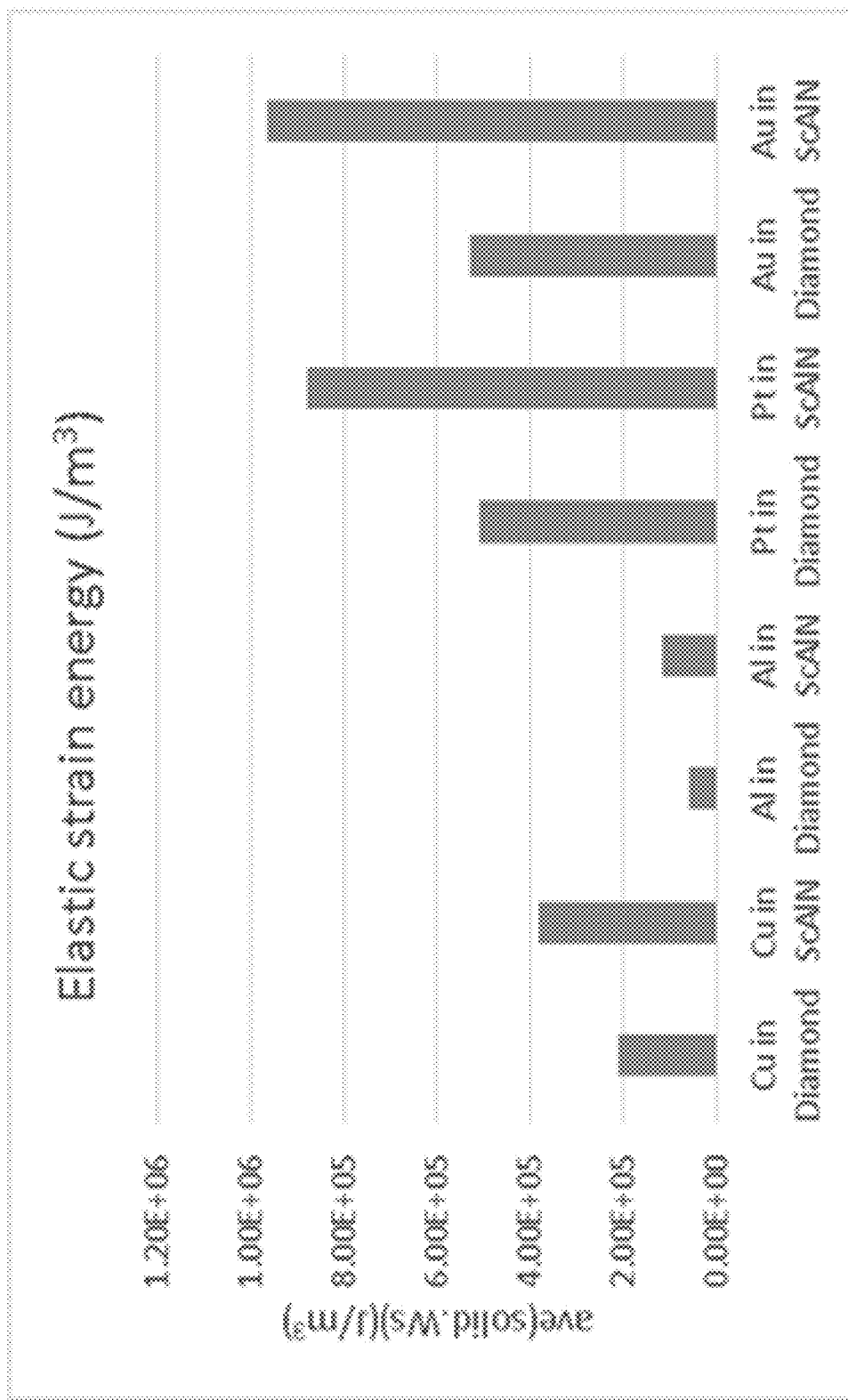
FIG. 9 is a plot showing simulated elastic strain energy inside the IDT electrodes for example SAW filters having IDT electrodes of different metals on the surface of the high acoustic velocity layer or below the surface of the high acoustic velocity layer.

Similar to FIGS. 4 and 7, elastic strain energy within the electrodes 108 were simulated for example SAW devices having different electrode metals, with the electrodes 108 being within the high acoustic velocity layer 206 (labeled as "in Diamond") or on the surface of the high acoustic velocity layer 206 (labeled as "in ScAlN"), and with the metallic layer 202 positioned on top of the piezoelectric layer 204. The simulated average elastic strain energy (J/m$^3$) inside the electrode 108 for the different example SAW devices is presented in FIG. 9. As may be observed, the average elastic strain energy density inside the electrode 108 is less in the example where the electrode 108 is within the high acoustic velocity layer 206 comparing to that in the example where the electrode 108 is within the piezoelectric layer 204.

Figure 10:
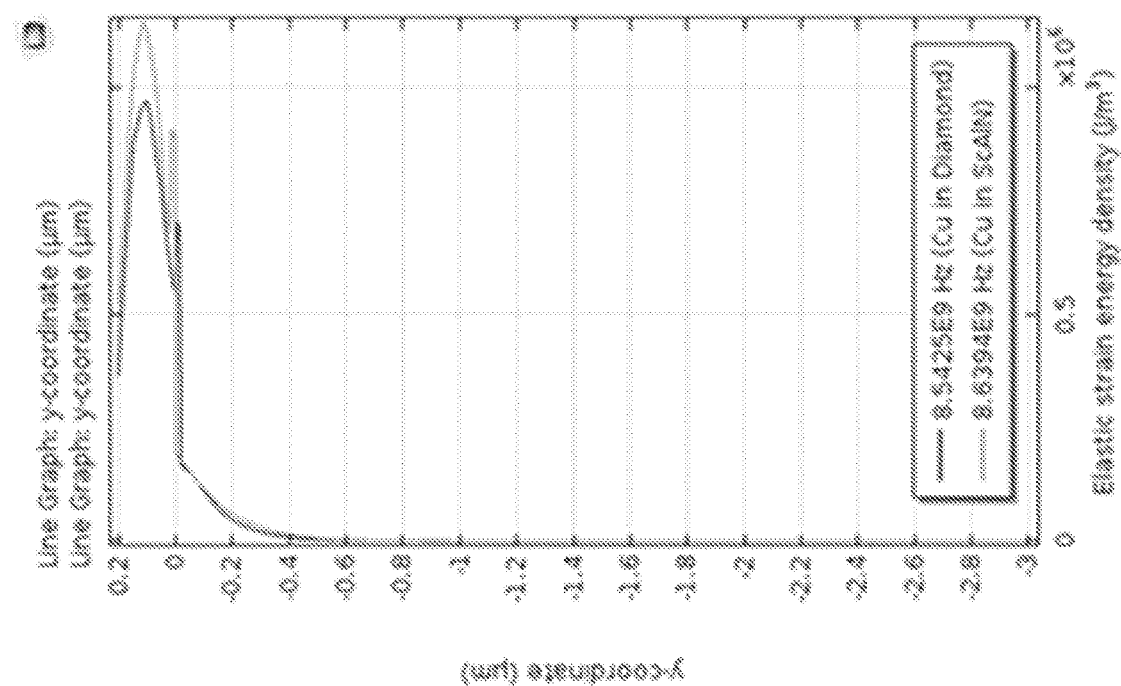
FIG. 10 shows simulated elastic strain energy densities along the depth direction of example SAW filters having IDT electrodes on the surface of the high acoustic velocity layer or below the surface of the high acoustic velocity layer.

FIG. 10 plots the elastic strain energy of two example SAW devices along the depth direction, along the center of the devices. FIG. 10 plots the elastic strain energy of an example SAW device in which the copper electrode 108 (at y-coordinate −0.02 μm to 0 μm) is within the high acoustic velocity layer 206 (labeled as "Cu in Diamond"), compared to the elastic strain energy of an example SAW device in which the copper electrode 108 (at y-coordinate 0 μm to 0.02 μm) is on the surface of the high acoustic velocity layer 206 (labeled as "Cu in ScAlN"). In both example devices, the metallic layer 202 is positioned on the piezoelectric layer 204. As may be observed, the average elastic energy inside the electrode 108 is less in the example where the electrode 108 is embedded within the high acoustic velocity layer 206.

Figure 11A:
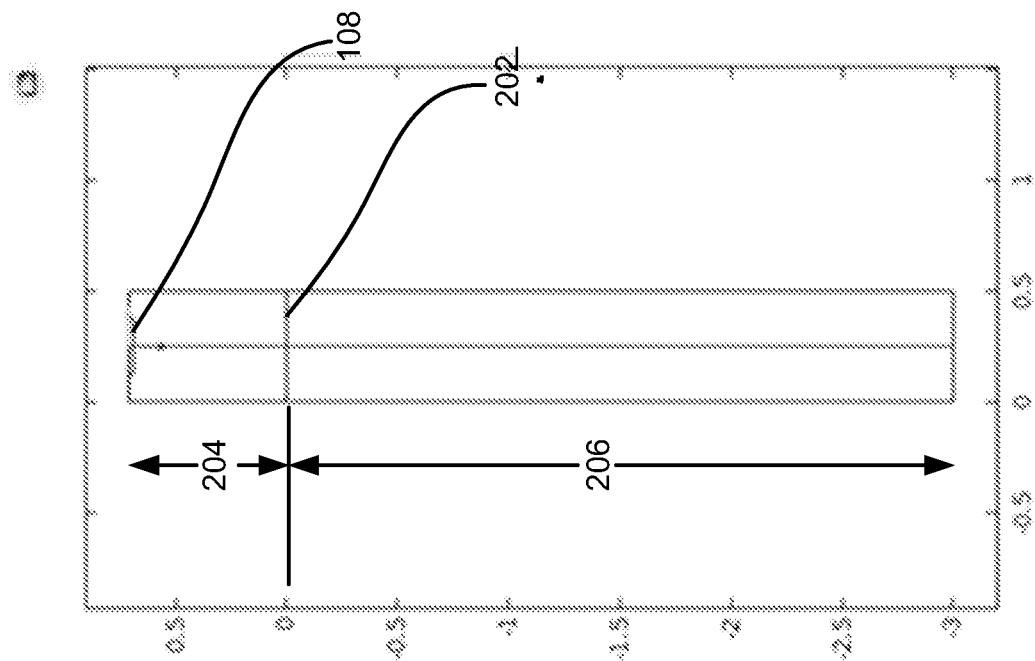
FIGS. 11A and 11B are side cross-section views of another example SAW device having the IDT electrodes on top of the piezoelectric layer and embedded in the piezoelectric layer, respectively.
Figure 11B:
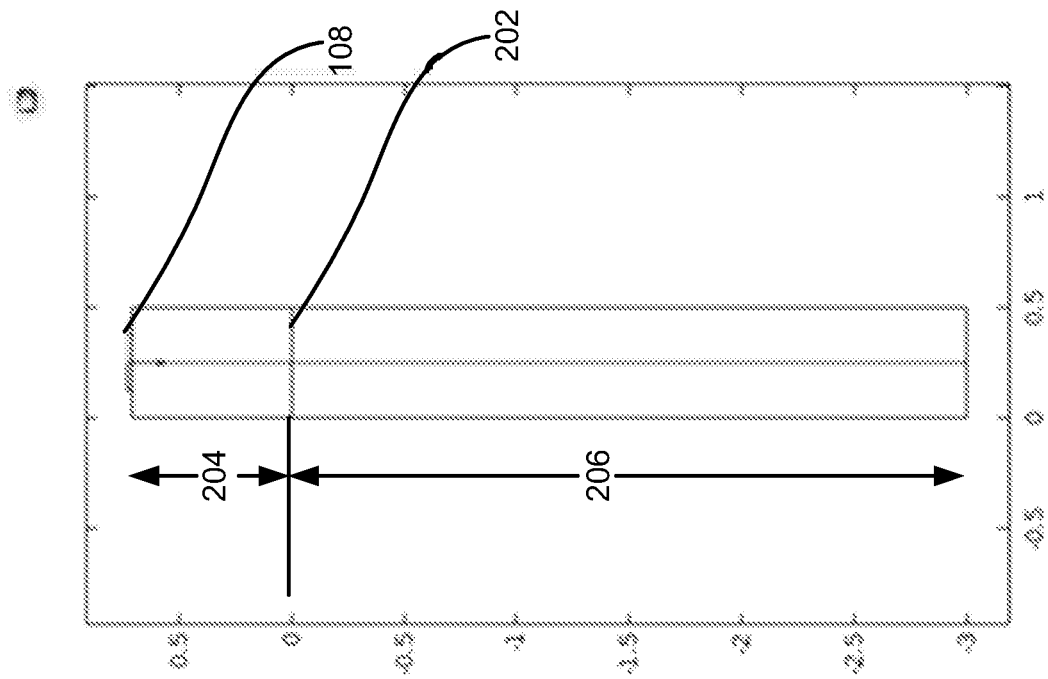

FIGS. 11A and 11B show cross-sectional views of example SAW devices in which the electrodes 108 are provided on the top surface of the piezoelectric layer 204 (that is, the surface of the piezoelectric layer 204 that is not coupled to the high acoustic velocity layer 206). In FIG. 11A the electrodes 108 are provided on the surface of the piezoelectric layer 204, and in FIG. 11B the electrodes 108 are provided below the surface of the piezoelectric layer 204. Simulations were performed based on a piezoelectric layer 204 of ScAlN having a thickness of 0.7λ, a high acoustic velocity layer 206 of diamond having a thickness of 3λ, electrodes 108 of copper having a thickness of 0.08λ, and inclusion of a copper metallic layer 202.

Generally, SAW energy tends to concentrate in the piezoelectric layer 204. Placing the electrode 108 outside of the piezoelectric layer 204 (but still in contact with the piezoelectric layer 204) may thus reduce the stress level inside the electrode 108, which may help to increase the lifetime of the SAW device. To illustrate this effect, the example configurations shown in FIGS. 11A and 11B were simulated.

In FIGS. 11A and 11B, the metallic layer 202 is provided between the piezoelectric layer 204 and the high acoustic velocity layer 206.

Figures 12A, 12B:
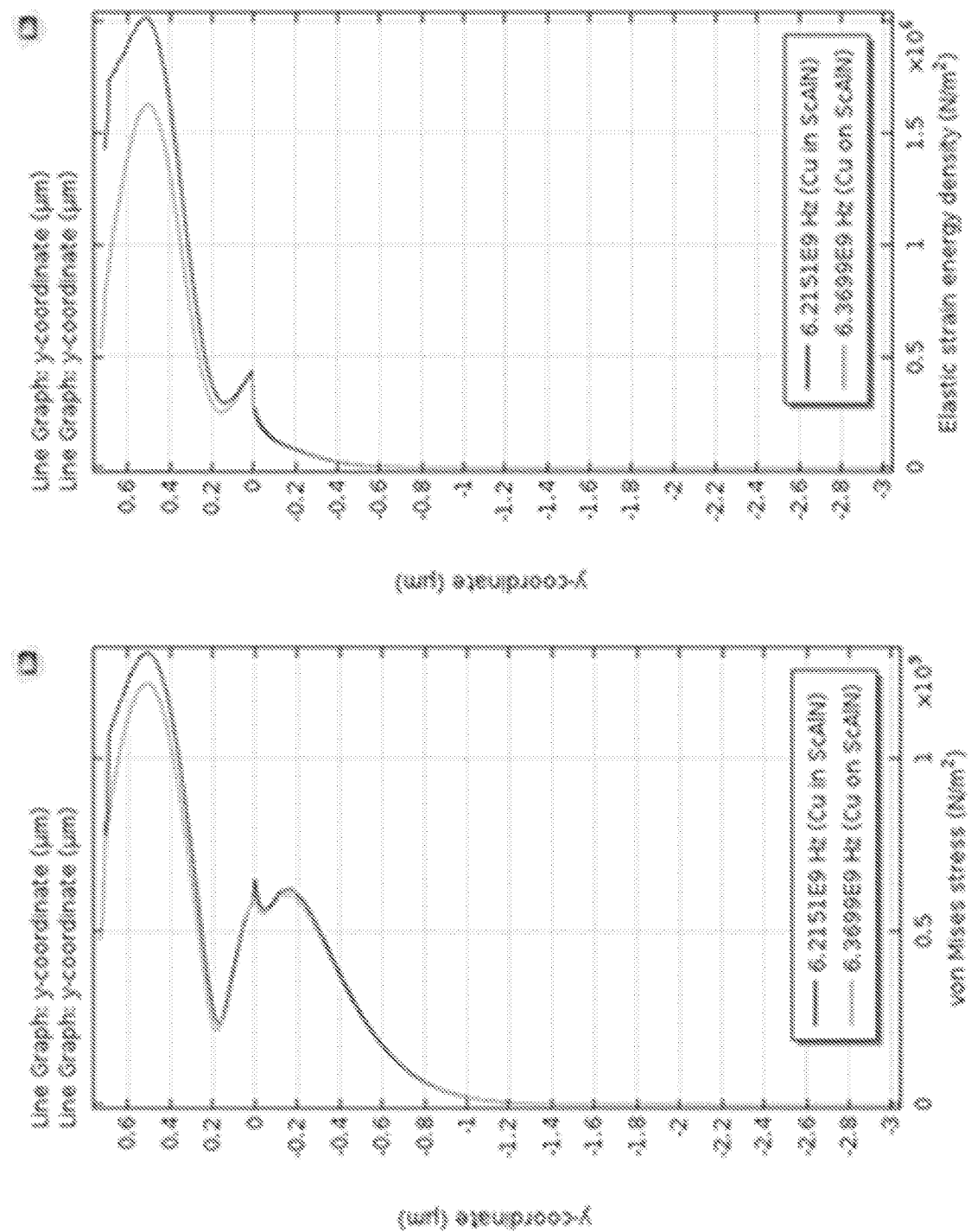
FIGS. 12A and 12B are plots showing simulations of the von Mises stress and elastic strain energy densities for the examples presented in FIGS. 11A and 11B.

FIG. 12A shows simulated von Mises stress along the depth of the SAW devices of FIG. 11A (labelled as "Cu on ScAlN") and 11B (labelled as "Cu in ScAlN"). FIG. 12B shows simulated elastic strain energy density along the depth of the SAW devices of FIGS. 11A and 11B. As may be observed from FIGS. 12A and 12B, the example SAW device having electrodes 108 on the surface of the piezoelectric layer 204 (as shown in FIG. 11A) was found to exhibit less von Mises stress and elastic strain energy density inside the IDT electrode 108 than the example SAW device having electrodes 108 embedded within the surface of the piezoelectric layer 204 (as shown in FIG. 11B). These results demonstrate that placing the electrode 108 outside of, but in contact with, the piezoelectric layer 204 results in lower stress than placing the electrode 108 embedded in the piezoelectric layer 204.

Figure 13:
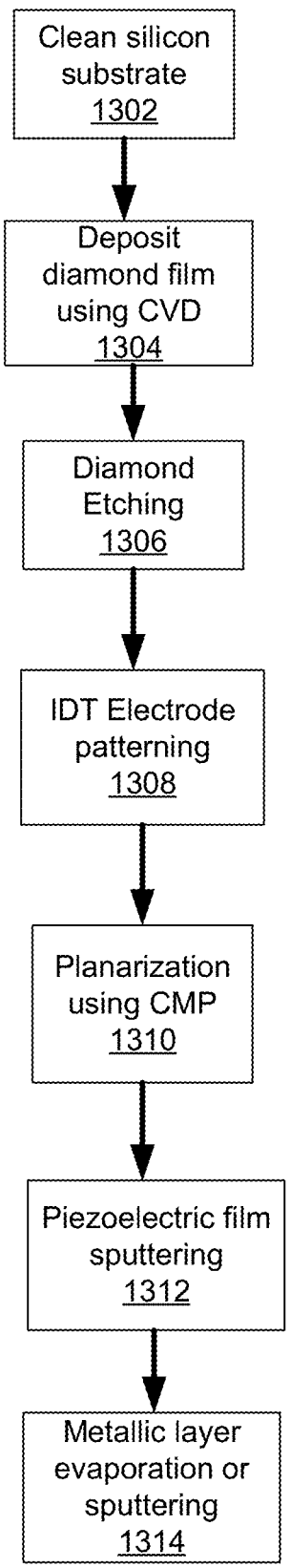
FIG. 13 is a flowchart illustrating an example method of manufacture of example SAW devices presented herein.

An example manufacturing process for some of the example SAW filters discussed herein is generally described with reference to FIG. 13. In particular, the example method illustrated in FIG. 13 may be used for manufacture of SAW devices in which the electrodes 108 are embedded in the high acoustic velocity layer 206 (e.g., as shown in FIG. 2B). Common steps may be described once and differences may be indicated where applicable. Although certain techniques may be described below, any suitable thin film or semiconductor manufacturing techniques may be used.

A silicon substrate may be cleaned (step 1302) to provide the base layer 208. A multi-crystalline diamond thin film may be deposited as a high acoustic velocity layer 206, using chemical vapor deposition (CVD) (step 1304). The high acoustic velocity layer 206 may be deposited to a thickness greater than the operating wavelength, such as for example 3λ.

Where the IDT electrodes 108 are to be embedded within the high acoustic velocity layer 206, such as in the embodiment of FIG. 2B, the high acoustic velocity layer 206 is etched (step 1306) to remove the portion of the high acoustic velocity layer 206 where the IDT electrodes 108 are to be patterned. The IDT electrodes 108 may then be patterned on etched areas of the high acoustic velocity layer 206 at step 1308, for example using standard photolithography and/or direct e-beam writing technology with a suitable metal, such as aluminum (Al), copper (Cu), platinum (Pt), Aluminum-copper alloys (Al/Cu/Al), or other metals or alloys. The surface of the high acoustic velocity layer 206 and the IDT electrodes 108 may then be planarized using chemical-mechanic planarization (CMP) at step 1310. The high acoustic velocity layer 206 along with the IDT electrodes 108 may be polished to a surface roughness significantly less than the operating wavelength, such as for example less than 3-nm root-mean squared (rms). The smoother the polished surface, the better the SAW propagation may be as the smoother surface may have less propagation loss.

For providing the piezoelectric layer 204, a thin film may then be grown on top of the embedded IDT electrodes 108 and the high acoustic velocity layer 206 using reactive pulsed direct current (DC) sputtering, with high purity Sc—Al alloy target, for example, at step 1312.

At step 1314, a metallic layer 202, such as aluminum, may be deposited on top of the piezoelectric layer 204. The metallic layer 202 may be evaporated using vacuum evaporation or sputtered using various sputtering techniques. The result of this example method is a SAW device similar to that described above with respect to FIG. 2B.

Figure 14:
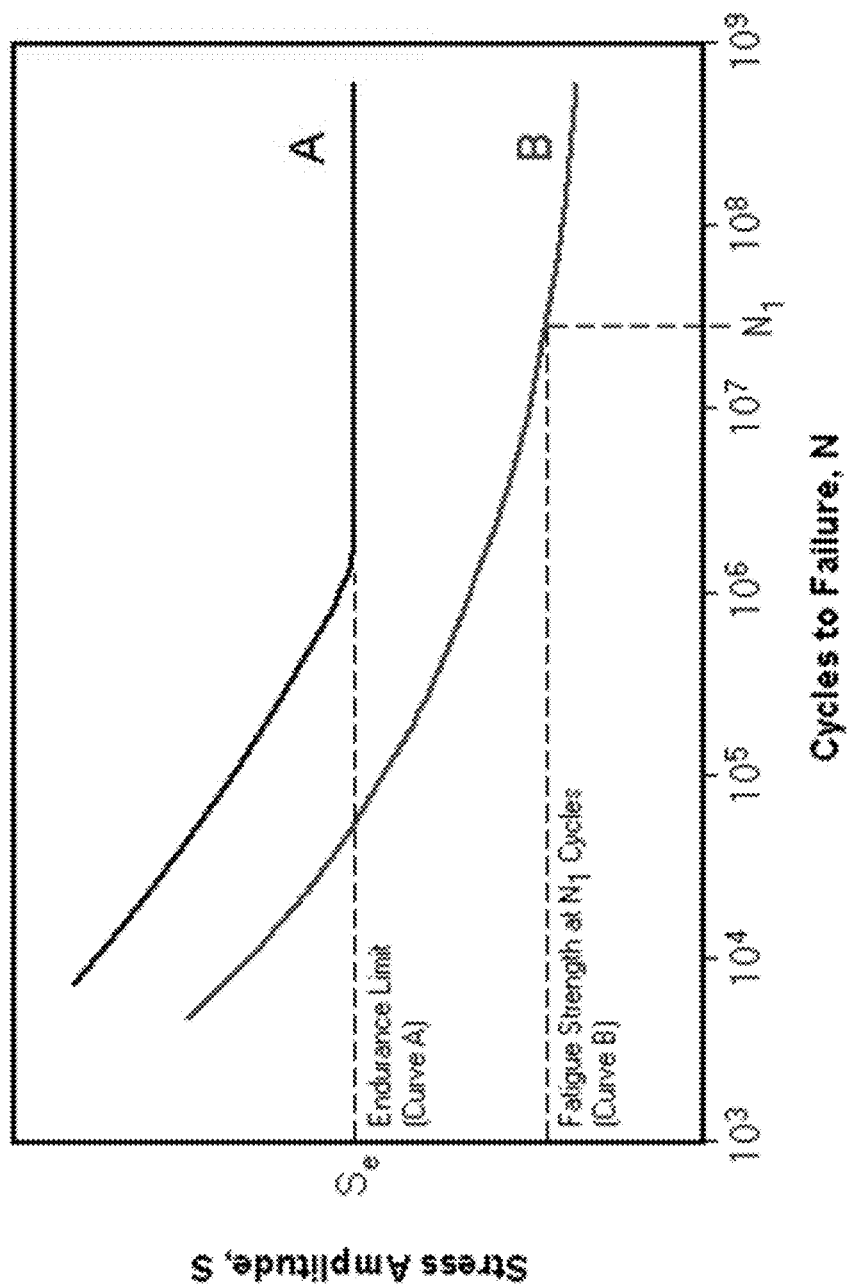
FIG. 14 is a plot illustrating the relationship between stress amplitude and cycles to failure.

It should be noted that achieving lower stress amplitude in the electrode, as in examples described in the present disclosure, is associated with longer lifetime of the SAW device. FIG. 14 plots the stress amplitude of the electrode vs. the number of cycles to failure. As shown in curve B of FIG. 14, reducing the stress results in increase in the number of cycles to failure, and therefore helps to increase the lifetime of the device. Some materials may exhibit an endurance limit, illustrated by curve A, where a stress amplitude below the endurance limit results in no failure regardless of the number of cycles. Regardless, it is generally desirable to reduce the stress amplitude within the SAW device.

Although the embodiments described herein disclose a SAW filter, the techniques herein may also be applied to other SAW devices including SAW resonators, duplexers, filters, or sensors. Some advantages described herein may benefit other SAW devices requiring high electromechanical coupling and/or uses a Sezawa wave mode to function.

Although the transducers 104 and 106 may be described herein as input and output transducers, it may be understood that the SAW device 100 may be bidirectional and use of the terms input and output was for ease of reference. Although the embodiments herein demonstrate two transducers for the SAW device, other embodiments may have a single transducer or a plurality of transducers. Although the embodiments herein demonstrate only transducer structures, other embodiments may comprise reflectors.

In example embodiments described herein that use ScAlN as the piezoelectric layer, doping concentrations of Sc in the ScAlN film between about 40-45 at. % may provide the highest electromechanical coupling coefficient.

Although CVD may been described herein for growing a diamond layer, other embodiments may use any suitable deposition technique including, for example, plasma enhanced CVD (PECVD), hot filament CVD (HFCVD), or microwave plasma enhanced CVD (MPCVD). Single crystal diamond substrate may also use a high pressure, high temperature (HPHT) method.

Although the IDT electrodes 108 herein may be described as using a metal such as aluminum (Al), copper (Cu), platinum (Pt), and/or Aluminum-copper alloys (Al/Cu/Al), the electrodes 108 may be made of any suitable material including, for example, molybdenum (Mo), tungsten (W), titanium (Ti), gold (Au), nickel (Ni) and titanium nitride (TiN), and silver (Ag), cobalt (Co), chromium (Cr), copper-iron alloy (Cu—Fe), niobium (Nb), nickel (Ni), zinc (Zn), zirconium (Zr), and/or alloys comprising any number of these metals.

Although the base layer 208 and high acoustic velocity layer 206 described herein may be two separate layers, these two layers may be replaced using a single crystal diamond substrate. In other example embodiments, the base layer 208 may not be silicon but may be another material that provides mechanical support for the high acoustic velocity layer 206. Silicon may be selected because it is a common substrate used in the semiconductor industry, a relatively low cost material, and/or a widely available material. Silicon may be replaced with other substrate materials as long as the high acoustic velocity layer 206 may be effectively grown on the base layer 208. In particular, for a diamond thin film, the silicon material may provide advantages over other types of materials.

In other example embodiments, the base layer 208 may be removed in the final device fabrication state (e.g. leaving only layers 202, 204, and 206), if so desired, as long as the high acoustic velocity layer 206 has sufficient strength to support itself and the other remaining components of the device 100. It may be useful to remove the base layer 208 in order to achieve a thinner device 100, for example for sensor application.

Although the metallic layer 202 herein is described as using a metal such as aluminum (Al), other metals may be suitable such as copper (Cu), platinum (Pt), and/or Aluminum-copper alloys (Al/Cu/Al), molybdenum (Mo), tungsten (W), titanium (Ti), gold (Au), nickel (Ni) and titanium nitride (TiN), and silver (Ag), cobalt (Co), chromium (Cr), copper-iron alloy (Cu—Fe), niobium (Nb), nickel (Ni), zinc (Zn), zirconium (Zr), and/or alloys comprising any number of these metals.

Although the electrodes 108 herein are described as using a metal such as aluminum (Al), other metals may be suitable such as copper (Cu), platinum (Pt), and/or Aluminum-copper alloys (Al/Cu/Al), molybdenum (Mo), tungsten (W), titanium (Ti), gold (Au), nickel (Ni) and titanium nitride (TiN), and silver (Ag), cobalt (Co), chromium (Cr), copper-iron alloy (Cu—Fe), niobium (Nb), nickel (Ni), zinc (Zn), zirconium (Zr), and/or alloys comprising any number of these metals.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure. For examples, although specific sizes and shapes of IDT electrodes 108 are disclosed herein, other sizes and shapes may be used. In another example, although a particular SAW device 100 (e.g. filter) may be described herein, the structures described may be adapted to other SAW device configurations.

The thicknesses of each of the layers 200 and 300 described herein are meant to be illustrative and not restrictive. The figures may exaggerate or minimize the height of these layers for illustrative purposes and/or for ease of reference.

Although the example embodiments may be described with reference to a particular orientation (e.g. top and base), this was simply used as a matter of convenience and ease of reference in describing the figures.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A surface acoustic wave device comprising:
   a piezoelectric layer;
   a high acoustic velocity layer coupled to the piezoelectric layer at a first surface of the high acoustic velocity layer;
   at least one transducer within the high acoustic velocity layer and flush with or near the first surface, the at least one transducer being configured to propagate a surface acoustic wave having an operating wavelength ($\lambda$) along the piezoelectric layer; and
   a base layer coupled to a second surface of the high acoustic velocity layer opposite to the first surface.

2. The surface acoustic wave device according to claim 1, further comprising a metallic layer on a surface of the piezoelectric layer opposite to the high acoustic velocity layer.

3. The surface acoustic wave device according to claim 2, wherein the metallic layer is formed from at least one of aluminum (Al), copper (Cu), platinum (Pt), Aluminum-copper alloys (Al/Cu/Al), molybdenum (Mo), tungsten (W), titanium (Ti), gold (Au), nickel (Ni) and titanium nitride (TiN), and silver (Ag), cobalt (Co), chromium (Cr), copper-iron alloy (Cu—Fe), niobium (Nb), nickel (Ni), zinc (Zn), or zirconium (Zr).

4. The surface acoustic wave device according to claim 1, wherein each of the at least one transducer comprises a plurality of interdigital transducer (IDT) electrodes, the IDT electrodes each having an IDT thickness.

5. The surface acoustic wave device according to claim 4, wherein the IDT thickness is between approximately $0.01\lambda$ and approximately $0.1\lambda$.

6. The surface acoustic wave device according to claim 5, wherein the IDT thickness is approximately $0.02\lambda$.

7. The surface acoustic wave device according to claim 5, wherein the IDT thickness is approximately $0.08\lambda$.

8. The surface acoustic wave device according to claim 4, wherein the IDT electrodes are formed from aluminum and/or copper.

9. The surface acoustic wave device according to claim 1, wherein a thickness of the piezoelectric layer is less than $\lambda$.

10. The surface acoustic wave device according to claim 9, wherein the thickness of the piezoelectric layer is between approximately $0.15\lambda$ and approximately $0.258\lambda$.

11. The surface acoustic wave device according to claim 9, wherein the thickness of the piezoelectric layer is approximately $0.2\lambda$.

12. The surface acoustic wave device according to claim 1, wherein the piezoelectric layer comprises a scandium-doped aluminum-nitride (ScAlN) layer.

13. The surface acoustic wave device according to claim 12, wherein scandium-doping of the ScAlN layer is between approximately 40 to approximately 45 atomic percent.

14. The surface acoustic wave device according to claim 1, wherein the high acoustic velocity layer comprises a diamond layer.

15. The surface acoustic wave device according to claim 14, wherein the diamond layer has a thickness greater than $\lambda$.

16. The surface acoustic wave device according to claim 1, wherein the high acoustic velocity layer has an acoustic velocity between approximately 8,000 m/s and approximately 10,000 m/s.

17. The surface acoustic wave device according to claim 1, wherein the at least one transducer comprises an input transducer and an output transducer.

18. The surface acoustic wave device according to claim 2, wherein the at least one transducer comprises an input transducer and an output transducer, and wherein the metallic layer overlaps both the input transducer and the output transducer, and the metallic layer extends between the input transducer and the output transducer.

\* \* \* \* \*